(12) United States Patent
Patraw et al.

(10) Patent No.: US 8,349,699 B2
(45) Date of Patent: Jan. 8, 2013

(54) METHODS OF FORMING TRENCH ISOLATION IN THE FABRICATION OF INTEGRATED CIRCUITRY AND METHODS OF FABRICATING INTEGRATED CIRCUITRY

(75) Inventors: Robert D. Patraw, Boise, ID (US); Martin Ceredig Roberts, Boise, ID (US); Keith R. Cook, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/211,174

(22) Filed: Aug. 16, 2011

(65) Prior Publication Data

US 2011/0300689 A1  Dec. 8, 2011

Related U.S. Application Data

(63) Continuation of application No. 11/097,876, filed on Apr. 1, 2005, now Pat. No. 8,012,847.

(51) Int. Cl.
*H01L 21/76* (2006.01)

(52) U.S. Cl. ........ 438/427; 438/221; 438/296; 438/404; 257/E29.02; 257/E21.54

(58) Field of Classification Search .............. 438/196, 438/221, 294, 296, 318, 353, 355, 359, 400, 438/404, 427; 257/93, 374, 501, 506, E29.02, 257/E21.54

See application file for complete search history.

(56) References Cited

U.S. PATENT DOCUMENTS

| | | | |
|---|---|---|---|
| 3,808,574 A | 4/1974 | De Luca | |
| 3,809,574 A | 5/1974 | Duffy et al. | |
| 3,990,927 A | 11/1976 | Montier | |
| 4,474,975 A | 10/1984 | Clemons et al. | |
| 4,836,885 A | 6/1989 | Breiten et al. | |
| 4,871,689 A | 10/1989 | Bergami et al. | |
| 5,105,253 A | 4/1992 | Polllock | |

(Continued)

FOREIGN PATENT DOCUMENTS

EP    0817251 A    1/1998

(Continued)

OTHER PUBLICATIONS

U.S. Appl. No. 10/806,923, Li et al., filed Mar. 2004.

(Continued)

*Primary Examiner* — Matthew Landau
*Assistant Examiner* — Colleen E Snow
(74) *Attorney, Agent, or Firm* — Wells St. John P.S.

(57) ABSTRACT

First and second isolation trenches are formed into semiconductive material of a semiconductor substrate. The first isolation trench has a narrowest outermost cross sectional dimension which is less than that of the second isolation trench. An insulative layer is deposited to within the first and second isolation trenches effective to fill remaining volume of the first isolation trench within the semiconductive material but not that of the second isolation trench within the semiconductive material. The insulative layer comprises silicon dioxide deposited from flowing TEOS to the first and second isolation trenches. A spin-on-dielectric is deposited over the silicon dioxide deposited from flowing the TEOS within the second isolation trench within the semiconductive material, but not within the first isolation trench within the semiconductive material. The spin-on-dielectric is deposited effective to fill remaining volume of the second isolation trench within the semiconductive material. The spin-on-dielectric is densified within the second isolation trench.

14 Claims, 6 Drawing Sheets

U.S. PATENT DOCUMENTS

| | | |
|---|---|---|
| 5,116,771 A | 5/1992 | Karulkar |
| 5,156,881 A | 10/1992 | Okano et al. |
| 5,182,221 A | 1/1993 | Sato |
| 5,387,539 A | 2/1995 | Yang et al. |
| 5,410,176 A | 4/1995 | Liou et al. |
| 5,470,798 A | 11/1995 | Ouellet |
| 5,492,858 A | 2/1996 | Bose et al. |
| 5,516,721 A | 5/1996 | Galli et al. |
| 5,518,959 A | 5/1996 | Jang et al. |
| 5,565,376 A | 10/1996 | Lur et al. |
| 5,604,149 A | 2/1997 | Paoli et al. |
| 5,616,513 A | 4/1997 | Shepard |
| 5,702,976 A | 12/1997 | Schuegraf et al. |
| 5,702,977 A | 12/1997 | Jang et al. |
| 5,719,085 A | 2/1998 | Moon et al. |
| 5,741,740 A | 4/1998 | Jang et al. |
| 5,770,469 A | 6/1998 | Uram et al. |
| 5,776,557 A | 7/1998 | Okano et al. |
| 5,786,039 A | 7/1998 | Brouquet |
| 5,786,263 A | 7/1998 | Perera |
| 5,801,083 A | 9/1998 | Yu et al. |
| 5,863,827 A | 1/1999 | Joyner |
| 5,883,006 A | 3/1999 | Iba |
| 5,888,880 A | 3/1999 | Gardner et al. |
| 5,895,253 A | 4/1999 | Akram |
| 5,895,255 A | 4/1999 | Tsuchiaki |
| 5,904,540 A | 5/1999 | Sheng et al. |
| 5,923,073 A | 7/1999 | Aoki et al. |
| 5,930,645 A | 7/1999 | Lyons et al. |
| 5,930,646 A | 7/1999 | Gerung et al. |
| 5,943,585 A | 8/1999 | May et al. |
| 5,950,094 A | 9/1999 | Lin et al. |
| 5,960,299 A | 9/1999 | Yew et al. |
| 5,972,773 A | 10/1999 | Liu et al. |
| 5,976,949 A | 11/1999 | Chen |
| 5,981,354 A | 11/1999 | Spikes et al. |
| 5,989,978 A | 11/1999 | Peidous |
| 5,998,280 A | 12/1999 | Bergemont et al. |
| 6,013,583 A | 1/2000 | Ajmera et al. |
| 6,030,881 A | 2/2000 | Papasouliotis et al. |
| 6,033,961 A | 3/2000 | Xu et al. |
| 6,051,477 A | 4/2000 | Nam |
| 6,069,055 A | 5/2000 | Ukeda et al. |
| 6,090,675 A | 7/2000 | Lee et al. |
| 6,127,737 A | 10/2000 | Kuroi et al. |
| 6,156,674 A | 12/2000 | Li et al. |
| 6,171,962 B1 | 1/2001 | Karlsson et al. |
| 6,187,651 B1 | 2/2001 | Oh |
| 6,190,979 B1 | 2/2001 | Radens et al. |
| 6,191,002 B1 | 2/2001 | Koyanagi |
| 6,245,641 B1 | 6/2001 | Shiozawa et al. |
| 6,265,282 B1 | 7/2001 | Lane et al. |
| 6,300,219 B1 | 10/2001 | Doan et al. |
| 6,326,282 B1 | 12/2001 | Park et al. |
| 6,329,266 B1 | 12/2001 | Hwang et al. |
| 6,331,380 B1 | 12/2001 | Ye et al. |
| 6,337,255 B1 | 1/2002 | Bradl et al. |
| 6,355,966 B1 | 3/2002 | Trivedi |
| 6,448,150 B1 | 9/2002 | Tsai et al. |
| 6,455,394 B1 | 9/2002 | Iyer et al. |
| 6,524,912 B1 | 2/2003 | Yang et al. |
| 6,534,395 B2 | 3/2003 | Werkhoven et al. |
| 6,583,028 B2 | 6/2003 | Doan et al. |
| 6,583,060 B2 | 6/2003 | Trivedi |
| 6,607,959 B2 | 8/2003 | Lee et al. |
| 6,617,251 B1 | 9/2003 | Kamath et al. |
| 6,674,132 B2 | 1/2004 | Willer |
| 6,719,012 B2 | 4/2004 | Doan et al. |
| 6,756,654 B2 | 6/2004 | Heo et al. |
| 6,759,298 B2 | 7/2004 | Lindsay et al. |
| 6,821,865 B2 | 11/2004 | Wise et al. |
| 6,869,860 B2 | 3/2005 | Belyansky et al. |
| 6,890,833 B2 | 5/2005 | Belyansky et al. |
| 6,930,058 B2 | 8/2005 | Hill et al. |
| 6,933,206 B2 | 8/2005 | Beintner et al. |
| 6,933,225 B2 | 8/2005 | Werkhoven et al. |
| 6,974,991 B2 | 12/2005 | Cheng et al. |
| 7,033,909 B2 | 4/2006 | Kim et al. |
| 7,049,661 B2 | 5/2006 | Yamada et al. |
| 7,053,010 B2 | 5/2006 | Li et al. |
| 7,125,815 B2 | 10/2006 | Vaartstra |
| 7,141,278 B2 | 11/2006 | Koh et al. |
| 7,157,385 B2 | 1/2007 | Derderian et al. |
| 7,160,787 B2 | 1/2007 | Heo et al. |
| 7,235,459 B2 | 6/2007 | Sandhu |
| 7,368,800 B2 | 5/2008 | Sandhu |
| 8,105,956 B2 | 1/2012 | Ho et al. |
| 2001/0006255 A1 | 7/2001 | Kwon et al. |
| 2001/0006839 A1 | 7/2001 | Yeo |
| 2001/0041250 A1 | 11/2001 | Haukka et al. |
| 2001/0046753 A1 | 11/2001 | Yeo |
| 2002/0000195 A1 | 1/2002 | Kao et al. |
| 2002/0004284 A1 | 1/2002 | Chen |
| 2002/0018849 A1 | 2/2002 | George et al. |
| 2003/0032281 A1 | 2/2003 | Werkhoven et al. |
| 2003/1003811 | 2/2003 | Carducci et al. |
| 2003/0129826 A1 | 7/2003 | Werkhoven et al. |
| 2003/0132479 A1* | 7/2003 | Nakamura et al. ............ 257/315 |
| 2004/0016987 A1 | 1/2004 | Sawada et al. |
| 2004/0032006 A1 | 2/2004 | Yun et al. |
| 2004/0082181 A1 | 4/2004 | Doan et al. |
| 2004/0144749 A1 | 7/2004 | Kim et al. |
| 2004/0209484 A1 | 10/2004 | Hill et al. |
| 2004/0248374 A1 | 12/2004 | Belyansky et al. |
| 2004/0266153 A1 | 12/2004 | Yongjun |
| 2005/0009293 A1 | 1/2005 | Kim et al. |
| 2005/0009368 A1 | 1/2005 | Vaartstra |
| 2005/0054213 A1 | 3/2005 | Derderian et al. |
| 2005/0079730 A1 | 4/2005 | Beintner et al. |
| 2005/0112282 A1 | 5/2005 | Gordon et al. |
| 2005/0124171 A1 | 6/2005 | Vaartstra |
| 2005/0136684 A1 | 6/2005 | Mukai et al. |
| 2005/0142799 A1 | 6/2005 | Seo |
| 2005/0170608 A1 | 8/2005 | Kiyotoshi et al. |
| 2005/0179112 A1 | 8/2005 | Belyansky et al. |
| 2006/0128139 A1 | 6/2006 | Paranjpe et al. |
| 2006/0189159 A1 | 8/2006 | Derderian et al. |
| 2006/0216906 A1 | 9/2006 | Smythe et al. |
| 2007/0281498 A1 | 12/2007 | Lee et al. |

FOREIGN PATENT DOCUMENTS

| | | |
|---|---|---|
| EP | 0959493 | 11/1999 |
| JP | 02277253 A | 11/1990 |
| JP | 05-315441 | 11/1993 |
| JP | 06-334031 | 12/1994 |
| JP | 146224 | 1/1996 |
| JP | 9325675 | 12/1997 |
| WO | 02/27063 A2 | 4/2002 |
| WO | PCT/US2004/021156 | 6/2004 |

OTHER PUBLICATIONS

U.S. Appl. No. 10/931,524, Sandhu, filed Aug. 2004.
Gasser et al., *Quasi-monolayer deposition of silicon dioxide*, 250 Thin Solid Films, pp. 213-218 (1994).
George et al., *Atomic layer controlled deposition of $SiO_2$ and $Al_2O_3$ using ABAB . . . binary reaction sequence Chemistry*, 82/83 Applied Surface Science, pp. 460-467 (1994).
Hasumann et al., *Catalytic vapor deposition of highly conformal silica nanolaminates*, Department of Chemistry and Chemical Biology, Harvard University, pp. 1-13 (May 14, 2002).
Chen et al., *Excimer Laser-Induced Ti Silicidation to Eliminate the Fine-Line Effect for Integrated Circuitry Device Fabrication*, 149 Journal of Electrochemical Society, No. 11, pp. G609-G612 (2002).
Nishiyama et al., *Agglomeration Resistant Self-Aligned Silicide Process Using $N_2$ Implantation into $TiSi_2$*, 36 Jpn. J. Appl. Phys., Part 1, No. 6A, pp. 3639-3643 (Jun. 1997).
Wolf, *Chapter 13: Polycides and Salicides of TiSix, CoSi2, and NiSi*, Silicon Processing for the VLSI Era, vol. IV, pp. 603-604 (pre-2003).
Beekmann et al., *Sub-micron Gap Fill and In-Situ Planarisation Using Flowfill™ Technology*, Electrotech 1-7 ULSI Conference, Portland, OR (Oct. 1995).
Curtis, et al., *APCVD TEOS: $O_3$ Advanced Trench Isolation Applications*, Semiconductor Fabtech, 9[th]Ed., pp. 241-247 (pre-Jul. 2003).
Disclosed Anonymous 32246, *Substrate Contact With Closed Bottom Trenches*, Research Disclosure, 1 page (Feb. 1991).

Hausmann et al., *Rapid Vapor Deposition of Highly Conformal Silica Nanolaminates*, 298 Science, pp. 402-406 (Oct. 11, 2002).

Horie et al., *Kinetics and Mechanism of the Reactions of $O(^3P)$ with $SiH_4$, $CH_3SiH_3$, $(CH_3)2SiH_2$, and $(CH_3)3SiH$*, 95 J. Phys. Chem., pp. 4393-4400 (1991).

Joshi et al., *Plasma Deposited Organosilicon Hydride Network Polymers as Versatile Resists for Entirely Dry Mid-Deep UV Photolithography*, 1925 SPIE, pp. 709-720 (1993).

Kiermasz et al., *Planarisation for Sub-Micron Devices Utilising a New Chemistry*, 1-2 Electrotech, DUMIC Conference, California (Feb. 1995).

Klaus et al., *Atomic Layer Deposition of $SiO_2$ Using Catalyzed and Uncatalyzed Self-Limiting Surface Reactions*, 6 Surface Review and Letters, Nos. 3 & 4, pp. 435-448 (1999).

Kojima et al., *Planarization Process Using a Multi-Coating of Spin-on-Glass*, V-MIC Conference, California, 2 pages (1995).

Matsuura et al., *A Highly Reliable Self-planarizing Low-k Intermetal Dielectric for Sub-quarter Micron Interconnects*, IEEE, pp. 785-788 (1997).

Matsuura et al., *Novel Self-planarizing CVD Oxide for Interlayer Dielectric Applications*, IEEE, pp. 117-120 (1994).

McClatchie et al., *Low Dielectric Constant Flowfill™ Technology for IMD Applications*, 7 pps. (pre-Aug. 1999).

Miller et al., *Self-limiting chemical vapor deposition of an ultra-thin silicon oxide film using tri-(tert-butoxy)silanol*, 397 Thin Solid Films, pp. 78-82 (2001).

Morishita et al., *Atomic-layer chemical-vapor-deposition of silicon-nitride*, 112 Applied Surface Science, pp. 189-204 (1997).

Shareef et al., *Subatmospheric chemical vapor deposition ozone/TEOS process for $SiO_2$ trench filling*, J. Vac. Sci. Technol. B 13(4), pp. 1888-1995 (Jul./Aug. 1995).

Withnall et al., *Matrix Reactions of Methylsilanes and Oxygen Atoms*, 92 J. Phys. Chem., pp. 594-602, 1988.

Yokoyama et al., *Atomic layer controlled deposition of silicon nitride and in situ growth observation by infrared reflection absorption spectroscopy*, 112 Applied Surface Science, pp. 75-81 (1997).

US04/021156, Jun. 2004, PCT Written Opinion.

\* cited by examiner

METHODS OF FORMING TRENCH ISOLATION IN THE FABRICATION OF INTEGRATED CIRCUITRY AND METHODS OF FABRICATING INTEGRATED CIRCUITRY

RELATED PATENT DATA

This patent resulted from a continuation of U.S. patent application Ser. No. 11/097,876 which was filed Apr. 1, 2005 and which is incorporated herein by reference in its entirety.

TECHNICAL FIELD

This invention relates to methods of forming trench isolation in the fabrication of integrated circuitry and to methods of fabricating integrated circuitry.

BACKGROUND OF THE INVENTION

In the fabrication of integrated circuitry, numerous devices are packed onto a single small area of a semiconductor substrate to create an integrated circuit. Many of the individual devices are electrically isolated from one another. Accordingly, electrical isolation is an integral part of semiconductor device design for preventing unwanted electrical coupling between adjacent components and devices.

As the size of integrated circuits is reduced, the devices that make up the circuits are positioned closer together. Conventional methods of isolating circuit components use trench isolation. Such is typically formed by etching trenches into a semiconductor substrate and filling the trenches with insulative material. As the density of components on the semiconductor substrate increased, the widths of the trenches have decreased. Further, it is not uncommon to find different areas of a substrate as having different width and/or different depth isolation trenches. Also and regardless, some areas of integrated circuitry have greater minimum active area spacing between isolation trenches than do other areas.

Insulative materials that are commonly utilized for electrical isolation within isolation trenches include silicon dioxide and silicon nitride. For example, it is common to thermally oxidize trench sidewalls within a silicon-comprising semiconductor substrate, and provide a thin silicon nitride layer thereover. The remaining volume of the trenches is then filled with an insulative material, for example high density plasma deposited silicon dioxide. Yet as trenches have become deeper and narrower, high density plasma deposited oxides can result in undesired void formation within the trenches during filling. Alternate techniques which provide better conformal deposition within isolation trenches include spin-on-dielectrics and chemical vapor deposition utilizing ozone and tetraethylorthosilicate (TEOS). Such latter processes, while resulting in good void-free gap filling, typically result in a silicon dioxide deposition which is not as dense as desired. Accordingly, a steam anneal at very high temperatures is typically utilized to densify the deposited silicon dioxide. To preclude undesired oxide formation of underlying material, a silicon nitride oxidation barrier layer is typically employed within all of the trenches to shield underlying material from being oxidized during the steam anneal.

Further and regardless, deposition using ozone/TEOS or high density plasma oxides typically requires deposition thicknesses much greater than the depths of the trenches themselves to get adequate fill within the trenches. This of course adds to the time required to later remove such material from laterally outward of the trenches. Further even with spin-on-dielectrics, it is sometimes very difficult to get the material to deep within high aspect ratio trenches, and to densify such material at the bases of such trenches.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

The invention includes methods of forming trench isolation in the fabrication of integrated circuitry, and methods of fabricating integrated circuitry. In one implementation, first and second isolation trenches are formed into semiconductive material of a semiconductor substrate. The first isolation trench has a narrowest outermost cross sectional dimension which is less than that of the second isolation trench. An insulative layer is deposited to within the first and second isolation trenches effective to fill remaining volume of the first isolation trench within the semiconductive material but not that of the second isolation trench within the semiconductive material. The insulative layer comprises silicon dioxide deposited from flowing TEOS to the first and second isolation trenches. In one aspect, a spin-on-dielectric is deposited over the silicon dioxide deposited from flowing the TEOS within the second isolation trench within the semiconductive material, but not within the first isolation trench within the semiconductive material. In one aspect, a spin-on-dielectric is deposited on the silicon dioxide deposited from flowing the TEOS within the second isolation trench within the semiconductive material (with "on" in the context of this document meaning in at least some direct, touching, physical contact therewith), but not within the first isolation trench within the semiconductive material. The spin-on-dielectric is deposited effective to fill remaining volume of the second isolation trench within the semiconductive material. The spin-on-dielectric is densified within the second isolation trench.

In one implementation, the first isolation trench has a largest aspect ratio of at least 25. In one implementation, the spin-on-dielectric is deposited over the semiconductor substrate laterally outward of the first and second isolation trenches to a thickness no greater than 4,500 Angstroms. In one implementation, the insulative layer comprising silicon dioxide deposited by flowing TEOS has a seam which extends at least partially into the first isolation trench. The densifying is preferably effective to remove such seam.

Other implementations and aspects are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
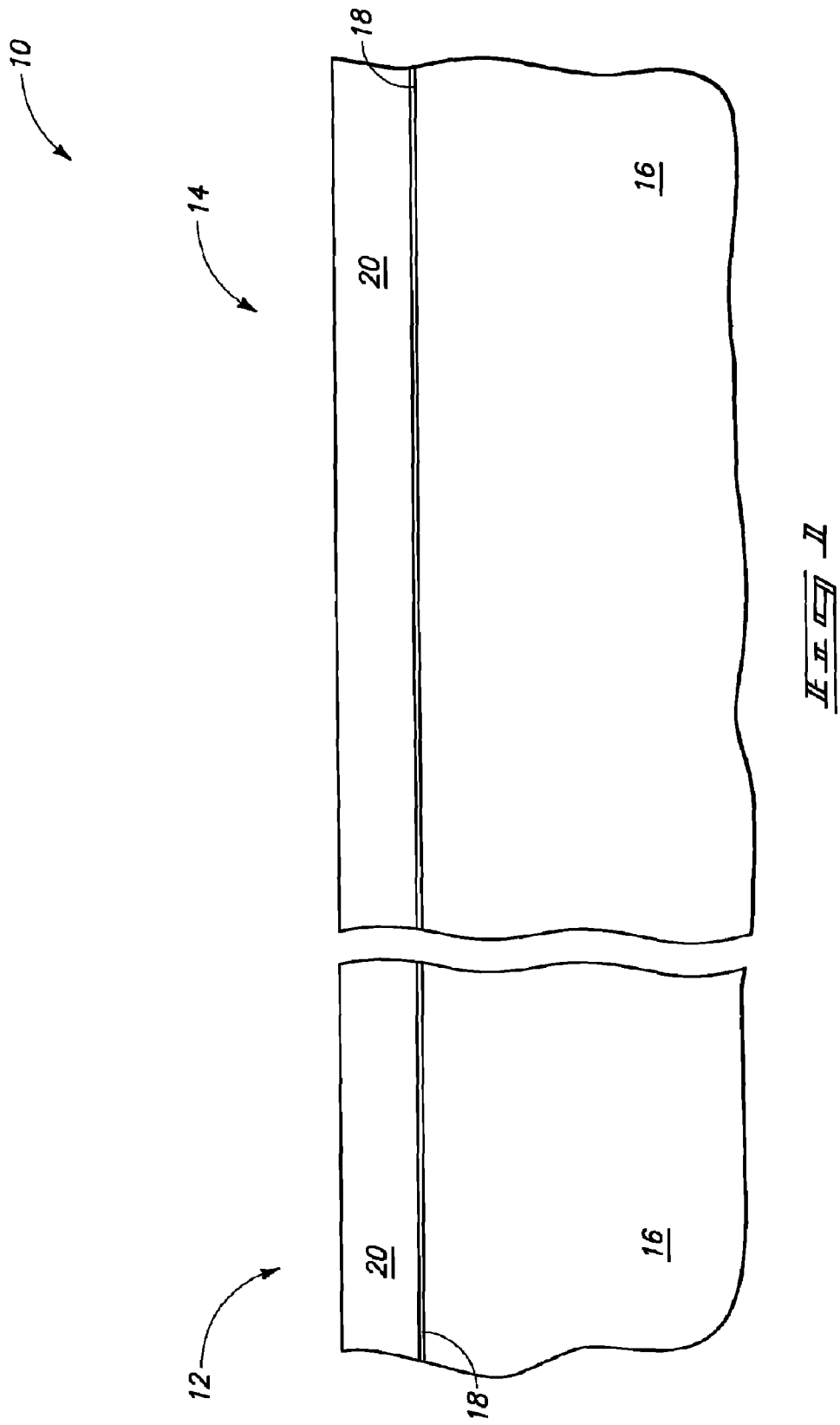
FIG. 1 is a fragmentary diagrammatic sectional view of a substrate in process in accordance with an aspect of the invention.

The invention contemplates methods of forming trench isolation in the fabrication of integrated circuitry and, in one exemplary preferred embodiment, in the fabricating of memory circuitry. Referring initially to FIG. 1, a semiconductor substrate is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. In one exemplary embodiment, FIG. 1 can be considered as depicting a first circuitry area 12 of semiconductor substrate 10 and a second circuitry area 14 of semiconductor substrate 10. In one exemplary implementation, the integrated circuitry being fabricated comprises memory circuitry with first circuitry area 12 comprising a memory array area and second circuitry area 14 comprising a peripheral circuitry area. In one exemplary implementation, the integrated circuitry comprises logic circuitry, with first circuitry area 12 comprising a logic circuitry area and second circuitry area 14 comprising metal routing area.

Semiconductor substrate 10 is depicted as comprising bulk semiconductive material 16, for example lightly doped monocrystalline silicon. Of course, semiconductor-on-insulator constructions and other substrates, whether existing or yet-to-be developed, are also contemplated. A pad oxide layer 18 has been formed over semiconductive material 16, and a silicon nitride masking layer 20 formed over pad oxide layer 18.

Figure 2:
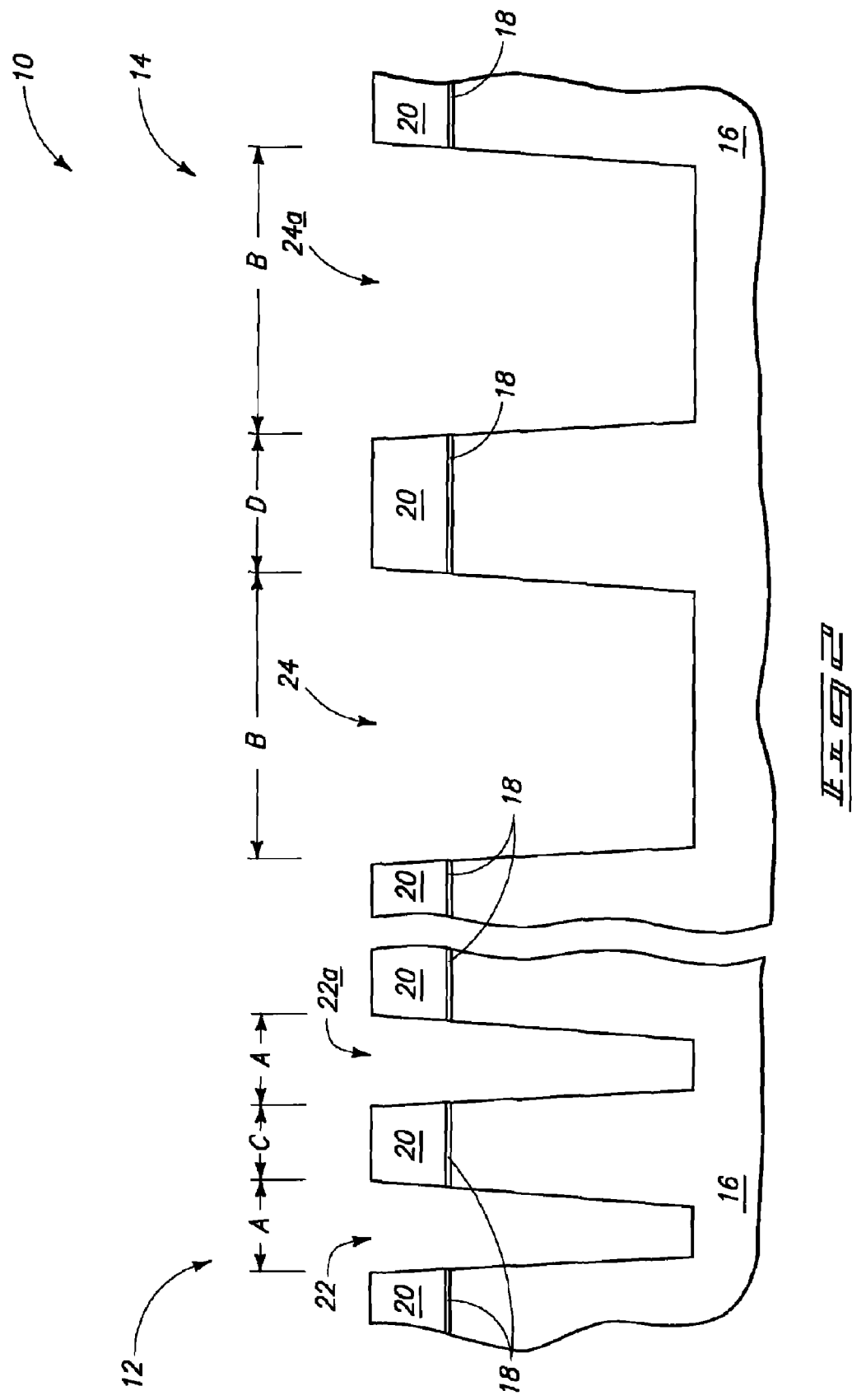
FIG. 2 is a view of the FIG. 1 substrate at a processing subsequent to that shown by FIG. 1.

Referring to FIG. 2, first isolation trenches 22, 22a and second isolation trenches 24, 24a, have been formed into semiconductive material 16 of semiconductor substrate 10. By way of example only, an exemplary technique for doing so comprises photolithographic patterning and etch. Trenches 22 and 22a might be of the same size and configuration or of different size and configuration relative to one another. Likewise, trenches 24 and 24a might be of the same size and configuration or of different size and configuration relative to one another. In one exemplary embodiment, isolation trenches 22, 22a as formed within semiconductive material 16 are formed within first circuitry area 12, while isolation trenches 24, 24a are formed within semiconductive material 16 received within second circuitry area 14. More than the illustrated pairs of such trenches would typically be fabricated in each of the respective areas, with only two of such trenches in each area being shown for clarity. Also, aspects of the invention contemplate fabrication with respect to only two different dimensioned trenches.

In the depicted exemplary embodiment, at least one of first isolation trenches 22, 22a has a narrowest outermost cross sectional dimension "A" which is less than that of at least one of second isolation trenches 24, 24a and which is depicted by dimension "B". By way of example only, an exemplary narrowest outermost dimension A for first isolation trenches 22, 22a is from 80 Angstroms to 100 Angstroms, while that for narrowest dimension B of second isolation trenches 24, 24a is from 1,020 Angstroms to 10,020 Angstroms. Such trenches might taper inwardly as shown, with an exemplary width at the trench bases being from 40 Angstroms to 60 Angstroms for isolation trenches 22, 22a, and from 1,000 Angstroms to 10,020 Angstroms for second isolation trenches 24, 24a. An exemplary depth range from the outermost surface of material 16 for trenches 22, 22a, 24 and 24a is from 3,000 Angstroms to 5,000 Angstroms, with 4,000 Angstroms being a specific preferred example. In one exemplary implementation, the first isolation trenches have respective largest aspect ratios of at least 25. In the context of this document, a "largest aspect ratio" is the maximum depth of the trench divided by its narrowest outermost cross sectional dimension. In further preferred embodiments, the first isolation trenches have respective largest aspect ratios of at least 30, of at least 40, and of at least 50.

Further and regardless, in one exemplary aspect of the invention, first circuitry area 12 comprises a first minimum active area spacing C between isolation trenches 22, 22a received therein and the second circuitry area comprises a second minimum active area spacing D between isolation trenches 24, 24a received therein. The first minimum active area spacing is less than the second minimum active area spacing. By way of example only, an exemplary first minimum active area spacing C is from 10 to 110 nanometers, while that for second minimum active area spacing D is from 200 to 800 nanometers.

Figure 3:
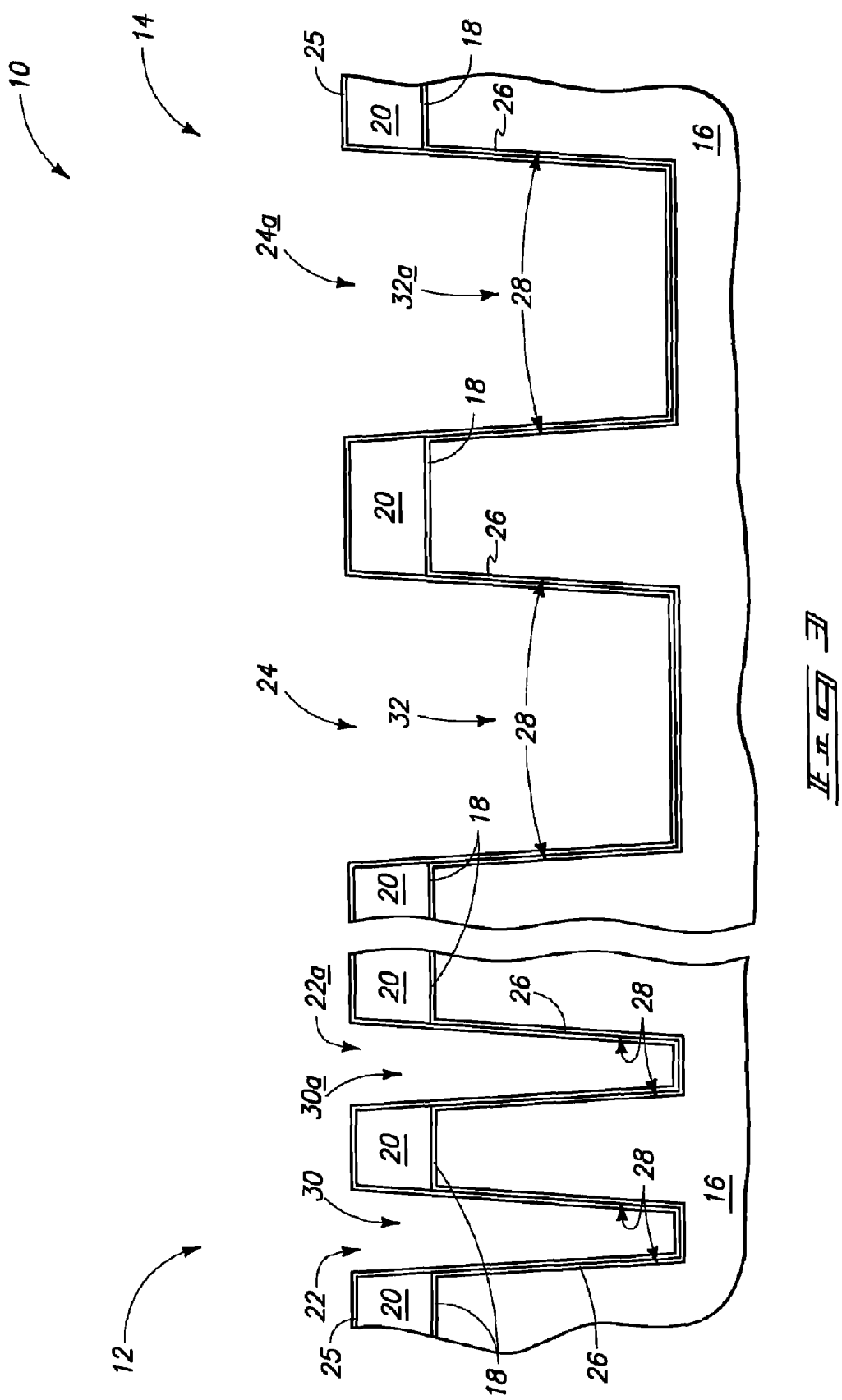
FIG. 3 is a view of the FIG. 2 substrate at a processing subsequent to that shown by FIG. 2.

Referring to FIG. 3, substrate 10 has been thermally oxidized to form silicon dioxide comprising layers 26 which line each of trenches 22, 22a and 24, 24a. An exemplary thickness range for silicon dioxide layer 26 is from 50 Angstroms to 75 Angstroms. By way of example only, an exemplary technique or forming such layer includes furnace oxidation at 800° C., for example using $O_2$ and/or $N_2$ exposure, followed by $H_2O$ exposure, followed again by $O_2$ and/or $N_2$ exposure. Such layer might be formed later in the process, or not at all. Further, FIG. 3 depicts a preferred silicon nitride-comprising layer 25 having been deposited over, and preferably on, layer 26. An exemplary thickness range for layer 25 is from 50 Angstroms to 90 Angstroms. Regardless, isolation trenches 22, 22a and 24, 24a can be considered as having semiconductive material sidewalls 28 and some remaining volume 30, 30a and 32, 32a respectively, within semiconductive material 16.

Figure 4:
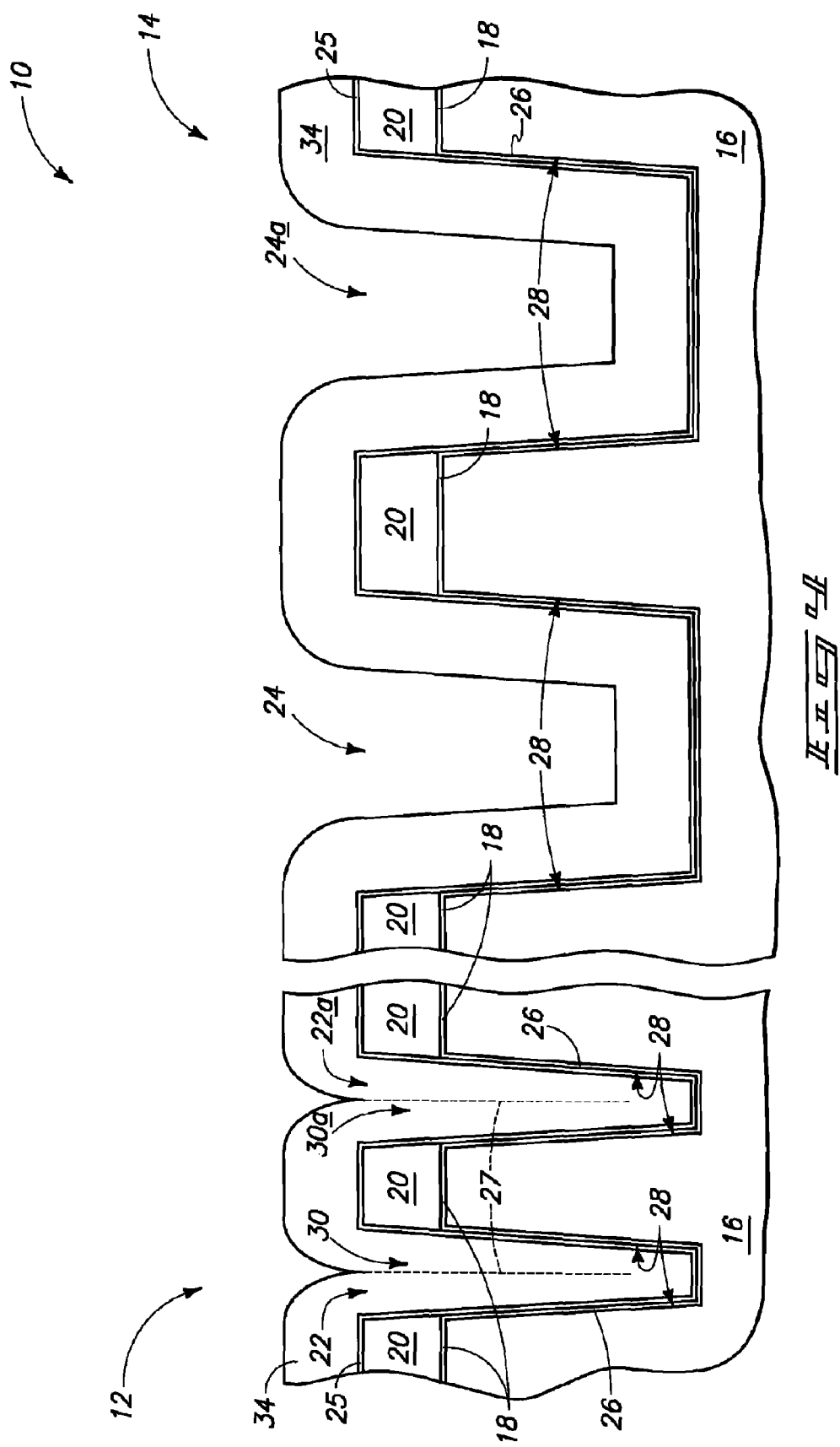
FIG. 4 is a view of the FIG. 3 substrate at a processing subsequent to that shown by FIG. 3.

Referring to FIG. 4, an insulative layer 34 is deposited to within first isolation trenches 22, 22a and second isolation trenches 24, 24a. In the depicted preferred embodiment, such insulative layer depositing is effective to fill remaining volumes 30, 30a of first isolation trenches 22, 22a within semiconductive material 16, but not those remaining volumes 32, 32a of second isolation trenches 24, 24a within semiconductive material 16. The insulative layer 34 comprises silicon dioxide deposited from flowing tetraethylorthosilicate (TEOS) to the first and second isolation trenches. Exemplary preferred pressure during the deposit of layer 34 is from 250 mTorr to 750 mTorr, with a preferred temperature being from 575° C. to 700° C. A specific example is 600 mTorr at 656° C. Exemplary preferred TEOS flow rate to a 4.8 L volume furnace within which a plurality of substrates is received is from 100 sccm to 150 sccm. Preferably the flow of gas to such substrates during the deposit consists essentially of TEOS, with 100% TEOS being more preferred. An exemplary preferred thickness range for insulative layer 34 is from 200

Angstroms to 950 Angstroms thick, with a more preferred thickness range being from 650 Angstroms to 750 Angstroms. A seam 27 might form which extends at least partially into first isolation trenches 22, 22a.

Figure 5:
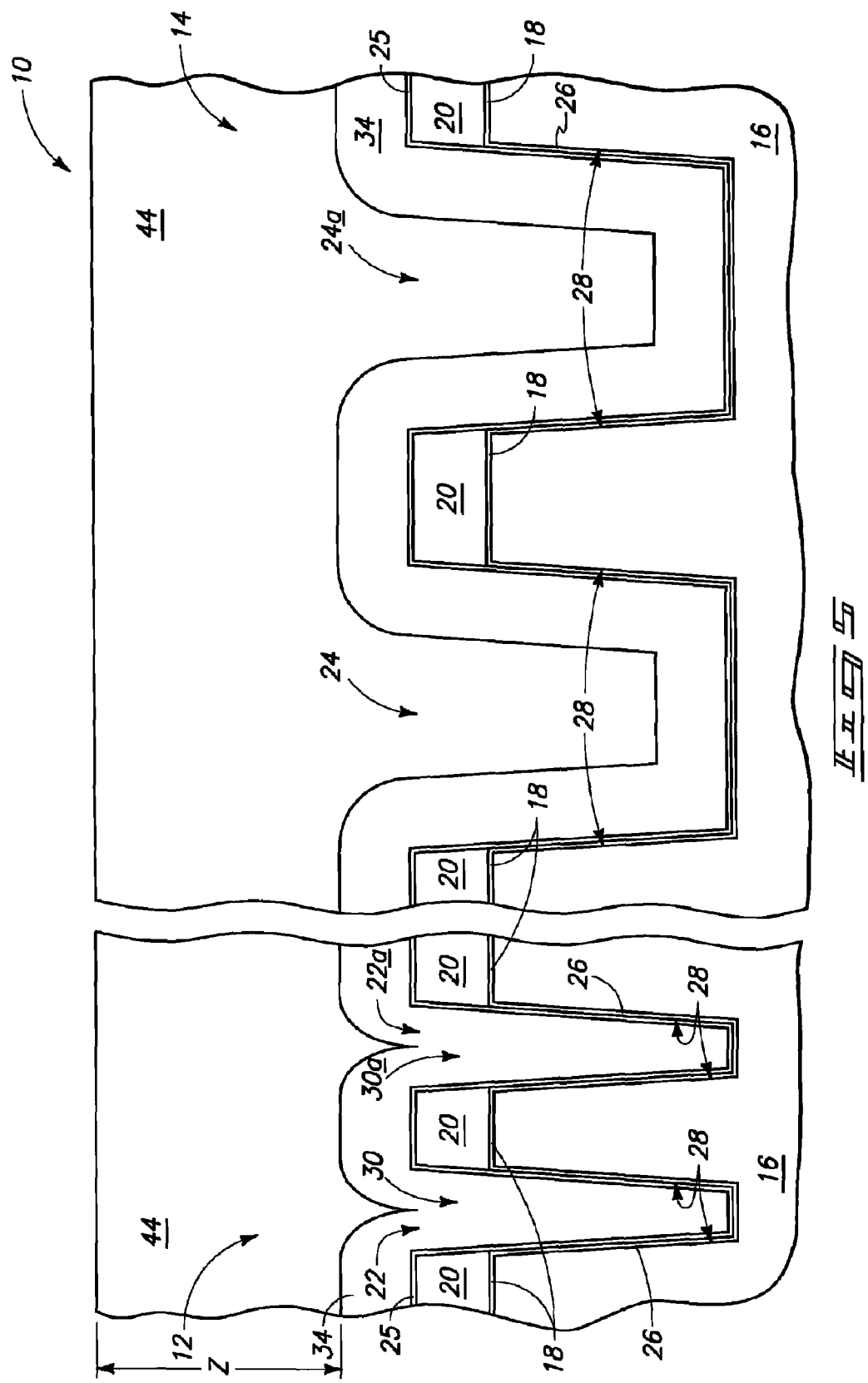
FIG. 5 is a view of the FIG. 4 substrate at a processing subsequent to that shown by FIG. 4.

Referring to FIG. 5, a spin-on-dielectric 44 has been deposited over, and preferable "on" as shown, the silicon dioxide 34 deposited from flowing the TEOS. Such has been deposited within the second isolation trenches 24, 24a within semiconductive material 16, but not to within first isolation trenches 22, 22a as such have been occluded at least with material 34. Such depositing has also been effective to fill respective remaining volumes of second isolation trenches 24, 24a. An exemplary method, and by way of example only, of forming spin-on-dielectric is to flow such a material onto the substrate at 23° C. and 45% humidity, followed by hot plate exposure at 150° C. for 180 seconds. Exemplary preferred materials are polysilazanes which convert to silicon dioxide upon densification. The spin-on-dielectric 44 is densified within second isolation trenches 24, 24a. In one depicted preferred embodiment where seams 27 were formed in insulative layer 34, the densification is preferably effective to remove such seams from within first isolation trenches 22, 22a. By way of example only, a preferred method of densifying includes atmospheric pressure and raising substrate temperature to 700° C. in an $O_2$ ambient, followed by a ramp to 800° C. at 20° C. per second, followed by steam exposure (for example by flowing $H_2$ and $O_2$) at from 950° C. to 1050° C. for 40 minutes, then a 30 minute dry in $O_2$ at from 950° C. to 1050° C.

In one preferred implementation, the spin-on-dielectric is deposited over the semiconductor substrate laterally outward of the first and second isolation trenches to a thickness "Z" which is no greater than 4,500 Angstroms, and more preferably to no greater than 4,000 Angstroms. Such can facilitate reduction in the amount of material over substrate material 16 that will typically be removed subsequently.

Figure 6:
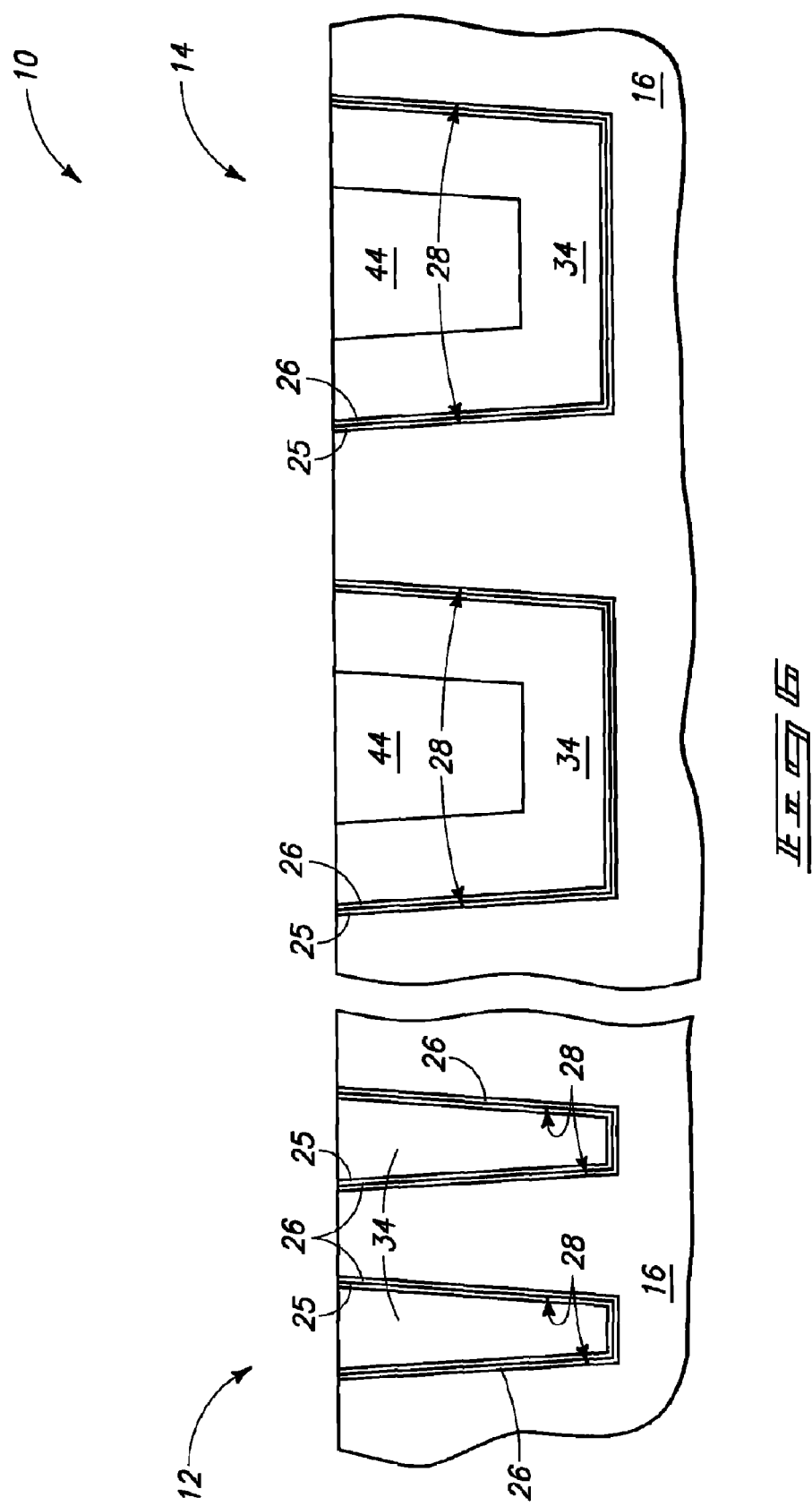
FIG. 6 is a view of the FIG. 5 substrate at a processing subsequent to that shown by FIG. 5.

Referring to FIG. 6, in one exemplary preferred embodiment, substrate 10 has been planarized back effective to remove materials 18, 20, 34, and 44 from outwardly of semiconductive material 16, thereby forming the illustrated trench isolation.

In one exemplary aspect, the invention also contemplates a method of fabricating integrated circuitry which includes forming isolation trenches within semiconductive material of a first circuitry area of a semiconductor substrate and within semiconductive material of a second circuitry area of the semiconductor substrate, by way of example only as described above in connection with FIG. 2. An insulative layer is deposited to within the isolation trenches of the first circuitry area and to within the isolation trenches of the second circuitry area, with the insulative layer less than filling the remaining volume of the isolation trenches within the semiconductive material of the second circuitry area. By way of example only, such is described and depicted above in connection with FIG. 4. After depositing the insulative layer, spin-on-dielectric is deposited and densified, for example as described above in connection with FIG. 5. In one preferred implementation, such a method comprises fabricating the integrated circuitry to comprise memory circuitry, with first circuitry area 14 to comprise a memory array area of dynamic random access memory (DRAM) cells. However of course, fabrication of other integrated circuitry and other memory circuitry is also contemplated, and whether such circuitry is existing or yet-to-be developed.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming trench isolation in the fabrication of integrated circuitry, comprising:

forming first and second isolation trenches into semiconductive material of a semiconductor substrate, the first isolation trench having a narrowest outermost cross sectional dimension which is less than that of the second isolation trench;

depositing an insulative layer to within the first and second isolation trenches effective to fill remaining volume of the first isolation trench within the semiconductive material but not that of the second isolation trench within the semiconductive material, the insulative layer comprising silicon dioxide deposited from flowing TEOS to the first and second isolation trenches;

depositing a spin-on-dielectric on the silicon dioxide deposited from flowing the TEOS within the second isolation trench within the semiconductive material, but not within the first isolation trench within the semiconductive material; and densifying the spin-on-dielectric within the second isolation trench utilizing a heat treatment in an O2 ambient followed by steam exposure and subsequent drying in O2.

2. The method of claim 1 wherein the first isolation trench has a largest aspect ratio of at least 25.

3. The method of claim 1 wherein the spin-on-dielectric is deposited over the semiconductor substrate laterally outward of the first and second isolation trenches to a thickness no greater than 4,500 Angstroms.

4. The method of claim 1 wherein the insulative layer comprising silicon dioxide deposited from flowing TEOS to the first and second isolation trenches has a seam extending at least partially into the first isolation trench, the densifying being effective to remove the seam.

5. The method of claim 1 wherein the insulative layer is deposited to a thickness from about 200 Angstroms to about 950 Angstroms.

6. The method of claim 1 further comprising oxidizing sidewalls of the first and second isolation trenches prior to depositing the insulative layer.

7. The method of claim 1 further comprising depositing a silicon nitride-comprising layer to within the first and second isolation trenches prior to depositing the insulative layer.

8. The method of claim 1 further comprising oxidizing sidewalls of the first and second isolation trenches prior to depositing the insulative layer, and depositing a silicon nitride-comprising layer to within the first and second isolation trenches over the oxidized sidewalls prior to depositing the insulative layer.

9. The method of claim 1 wherein gas flow to the first and second isolation trenches during depositing the insulative layer consists essentially of TEOS.

10. The method of claim 1 wherein gas flow to the first and second isolation trenches during depositing the insulative layer is 100% TEOS.

11. A method of forming trench isolation in the fabrication of integrated circuitry, comprising:

forming first and second isolation trenches into semiconductive material of a semiconductor substrate, the first isolation trench having a largest aspect ratio of at least 25;

depositing an insulative layer to within the first and second isolation trenches effective to fill remaining volume of the first isolation trench within the semiconductive material but not that of the second isolation trench within the semiconductive material;

depositing a spin-on-dielectric over the insulative layer within the second isolation trench within the semiconductive material, but not within the first isolation trench within the semiconductive material; the spin-on-dielectric being deposited effective to fill remaining volume of the second isolation trench within the semiconductive material; and densifying the spin-on-dielectric within the second isolation trench by performing a heat treatment in an O2 ambient followed by steam treatment and subsequent drying in O2.

12. A method of forming trench isolation in the fabrication of integrated circuitry, comprising:

forming first and second isolation trenches into semiconductive material of a semiconductor substrate;

depositing an insulative layer to within the first and second isolation trenches effective to fill remaining volume of the first isolation trench within the semiconductive material but not that of the second isolation trench within the semiconductive material;

depositing a spin-on-dielectric over the silicon dioxide deposited from flowing the TEOS within the second isolation trench within the semiconductive material, but not within the first isolation trench within the semiconductive material; the spin-on-dielectric being deposited effective to fill remaining volume of the second isolation trench within the semiconductive material, the spin-on-dielectric being deposited over the semiconductor substrate laterally outward of the first and second isolation trenches to a thickness no greater than 4,500 Angstroms; and densifying the spin-on-dielectric within the second isolation trench by heat treatment in an O2 ambient followed by steam exposure and subsequent drying in O2.

13. The method of claim 12 wherein the integrated circuitry comprises memory circuitry, the first circuitry area comprising a memory array area and the second circuitry area comprising peripheral circuitry area.

14. The method of claim 13 comprising fabricating the memory array area to comprise DRAM.

\* \* \* \* \*

UNITED STATES PATENT AND TRADEMARK OFFICE
CERTIFICATE OF CORRECTION

PATENT NO. : 8,349,699 B2  Page 1 of 1
APPLICATION NO. : 13/211174
DATED : January 8, 2013
INVENTOR(S) : Robert D. Patraw et al.

It is certified that error appears in the above-identified patent and that said Letters Patent is hereby corrected as shown below:

In column 6, line 31, in Claim 1, delete "O2" and insert -- $O_2$ --, therefor.

In column 6, line 33, in Claim 1, delete "O2" and insert -- $O_2$ --, therefor.

In column 7, line 18, in Claim 11, delete "O2" and insert -- $O_2$ --, therefor.

In column 7, line 20, in Claim 11, delete "O2" and insert -- $O_2$ --, therefor.

In column 8, line 16, in Claim 12, delete "O2" and insert -- $O_2$ --, therefor.

In column 8, line 17, in Claim 12, delete "O2" and insert -- $O_2$ --, therefor.

In column 8, line 23, in Claim 14, delete "DRAM." and insert -- DRAM cells. --, therefor.

Signed and Sealed this
Second Day of April, 2013

Teresa Stanek Rea
*Acting Director of the United States Patent and Trademark Office*